US012575063B2

(12) United States Patent
Liang

(10) Patent No.: US 12,575,063 B2
(45) Date of Patent: Mar. 10, 2026

(54) ACTIVE 2-PHASE MIST-STREAM COOLING SYSTEM

(71) Applicant: xMEMS Labs, Inc., Santa Clara, CA (US)

(72) Inventor: Jemm Yue Liang, Sunnyvale, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/900,960

(22) Filed: Sep. 30, 2024

(65) Prior Publication Data

US 2025/0113464 A1 Apr. 3, 2025

Related U.S. Application Data

(60) Provisional application No. 63/696,398, filed on Sep. 19, 2024, provisional application No. 63/694,070, filed on Sep. 12, 2024, provisional application No. 63/693,139, filed on Sep. 10, 2024, provisional application No. 63/549,563, filed on Feb. 4, 2024, provisional application No. 63/542,281, filed on Oct. 3, 2023.

(51) Int. Cl.
H05K 7/20 (2006.01)
(52) U.S. Cl.
CPC ..... H05K 7/20327 (2013.01); H05K 7/20345 (2013.01); H05K 7/20354 (2013.01); H05K 7/20318 (2013.01)

(58) Field of Classification Search
None
See application file for complete search history.

(56) References Cited

U.S. PATENT DOCUMENTS

| | | | |
|---|---|---|---|
| 11,778,783 B2 * | 10/2023 | Eadelson | ............ F28D 15/0266 |
| | | | 361/700 |
| 2001/0002541 A1 | 6/2001 | Patel | |
| 2001/0037649 A1 * | 11/2001 | Fujitaka | .................. F25B 39/00 |
| | | | 62/114 |
| 2002/0163782 A1 | 11/2002 | Cole | |
| 2004/0250562 A1 | 12/2004 | Adiga | |
| 2006/0272342 A1 * | 12/2006 | Bash | ........................ F24F 11/30 |
| | | | 62/199 |
| 2007/0183126 A1 * | 8/2007 | Tilton | ................ H05K 7/20172 |
| | | | 361/699 |

(Continued)

FOREIGN PATENT DOCUMENTS

| | | |
|---|---|---|
| CN | 111511164 B | 5/2023 |
| EP | 2 360 725 A2 | 8/2011 |

(Continued)

*Primary Examiner* — Courtney L Smith
(74) *Attorney, Agent, or Firm* — Winston Hsu

(57) ABSTRACT
The cooling system comprises a channel encompassing a heat source; a coolant-droplets introducer configured to introduce coolant droplets into the channel, wherein the coolant droplets vaporize as coolant gas in the channel due to heat generated by the heat source; a compressor configured to pump an air from a channel subspace into a condenser subspace, wherein the air comprises the coolant gas; and a condenser configured to condense the coolant gas into coolant droplets or coolant liquid. The coolant liquid is introduced to or for the coolant-droplets introducer.

14 Claims, 4 Drawing Sheets

(56) References Cited

U.S. PATENT DOCUMENTS

| | | | | |
|---|---|---|---|---|
| 2009/0086434 A1* | 4/2009 | Hodes | ............... | H05K 7/20609 |
| | | | | 361/700 |
| 2010/0039773 A1 | 2/2010 | Tilton | | |
| 2011/0277967 A1* | 11/2011 | Fried | .................. | F28D 15/0266 |
| | | | | 165/104.26 |
| 2012/0312504 A1* | 12/2012 | Suzuki | ................... | F25B 39/04 |
| | | | | 62/190 |
| 2015/0109730 A1* | 4/2015 | Campbell | ........... | F28D 15/0266 |
| | | | | 165/104.27 |
| 2015/0292084 A1* | 10/2015 | Glaudel | ................ | C23C 16/455 |
| | | | | 700/282 |
| 2016/0118317 A1* | 4/2016 | Shedd | ....................... | F28F 9/26 |
| | | | | 257/712 |
| 2020/0163254 A1* | 5/2020 | Eadelson | ........... | H05K 7/20327 |
| 2021/0153391 A1* | 5/2021 | Gao | ................... | H05K 7/20327 |
| 2022/0346284 A1* | 10/2022 | Heydari | ............. | H05K 7/20827 |

FOREIGN PATENT DOCUMENTS

| | | | |
|---|---|---|---|
| EP | 3 598 859 A1 | 1/2020 | |
| JP | 2003-509874 A | 3/2003 | |
| JP | 2012-138473 A | 7/2012 | |
| JP | 2015-19076 A | 1/2015 | |
| JP | 2019-516195 A | 6/2019 | |
| JP | 7251628 B2 | 4/2023 | |

* cited by examiner

ACTIVE 2-PHASE MIST-STREAM COOLING SYSTEM

CROSS REFERENCE TO RELATED APPLICATIONS

This application claims the benefit of U.S. Provisional Application No. 63/542,281, filed on Oct. 3, 2023. Further, this application claims the benefit of U.S. Provisional Application No. 63/549,563, filed on Feb. 4, 2024. Further, this application claims the benefit of U.S. Provisional Application No. 63/693,139, filed on Sep. 10, 2024. Further, this application claims the benefit of U.S. Provisional Application No. 63/694,070, filed on Sep. 12, 2024. Further, this application claims the benefit of U.S. Provisional Application No. 63/696,398, filed on Sep. 19, 2024. The contents of these applications are incorporated herein by reference.

BACKGROUND OF THE INVENTION

1. Field of the Invention

The present application relates to a cooling system, and more particularly, to an active 2-phase mist-stream cooling system.

2. Description of the Prior Art

Conventional cooling systems can be classified by passive versus active, 1-phase versus 2-phase. Among 1-phase cooling, the system can be classified by air-cooling and liquid-cooling. Typical examples of cooling system for electronics devices range from 1-phase cooling systems such as passive and/or active air-cooling, active water-cooling, to 2-phase cooling systems such as vapor-chamber heat-spreader and 2-phase liquid immersion cooling. Due to the utilization of latent heat absorption/release during gas-liquid phase changes, 2-phase liquid immersion cooling can achieve extremely high heat dissipation rate.

However, the downsides of 2-phase immersion cooling systems include the difficulties during installation, the troubles in containing the vapor during operation, the messiness during maintenance, and the potential interactions between cooling fluid and electronic components including cables.

Therefore, it is necessary to improve the prior art.

SUMMARY OF THE INVENTION

It is therefore a primary objective of the present application to provide an active 2-phase mist-stream cooling system, to improve over disadvantages of the prior art.

An embodiment of the present application discloses a cooling system. The cooling system comprises a channel encompassing a heat source; a coolant-droplets introducer configured to introduce coolant droplets into the channel, wherein the coolant droplets vaporize as coolant gas in the channel due to heat generated by the heat source; a compressor configured to pump an air from a channel subspace into a condenser subspace, wherein the air comprises the coolant gas; and a condenser configured to condense the coolant gas into coolant droplets or coolant liquid. The coolant liquid is introduced to or for the coolant-droplets introducer.

These and other objectives of the present invention will no doubt become obvious to those of ordinary skill in the art after reading the following detailed description of the preferred embodiment that is illustrated in the various figures and drawings.

DETAILED DESCRIPTION

All the shortcomings of 2-phase immersion cooling systems will vanish if the structure of "immersion within a body of coolant liquid" is modified to become "immersion within a stream of moving coolant mist", wherein "coolant mist" refers to a collection of airborne coolant droplets, i.e. tiny drops of coolant, suspended within a gaseous transport medium, where the transport medium flows at a suitably fast rate, forming a stream of moving coolant mist.

In this invention, an active 2-phase mist-stream cooling system is introduced, where a stream or mist-stream (e.g., 114 shown below) comprising a gaseous transport medium, infused with a mist of airborne coolant droplets, is forced (by actively pushing or sucking) into heat generating regions (e.g., 115 shown below) where the heat is absorbed, as latent vaporization heat, when the coolant droplets are infused within the mist-stream vaporize. The resulting coolant vapor, carried by the same gaseous transport medium, is subsequently forced (by actively pushing or sucking) into condenser (e.g., 107 shown below) where the coolant vapor condenses back to the liquid phase, releasing heat (as latent condensation heat) during the condensation process.

In the present application, unless specified specifically, the term "air" may be used interchangeably with the term "gaseous transport medium" and both terms may refer, but not limited, to the air in the atmosphere or any other suitable gaseous medium where microscopic coolant droplets can be suspended in an airborne manner, forming a mist-stream.

Figure 1:
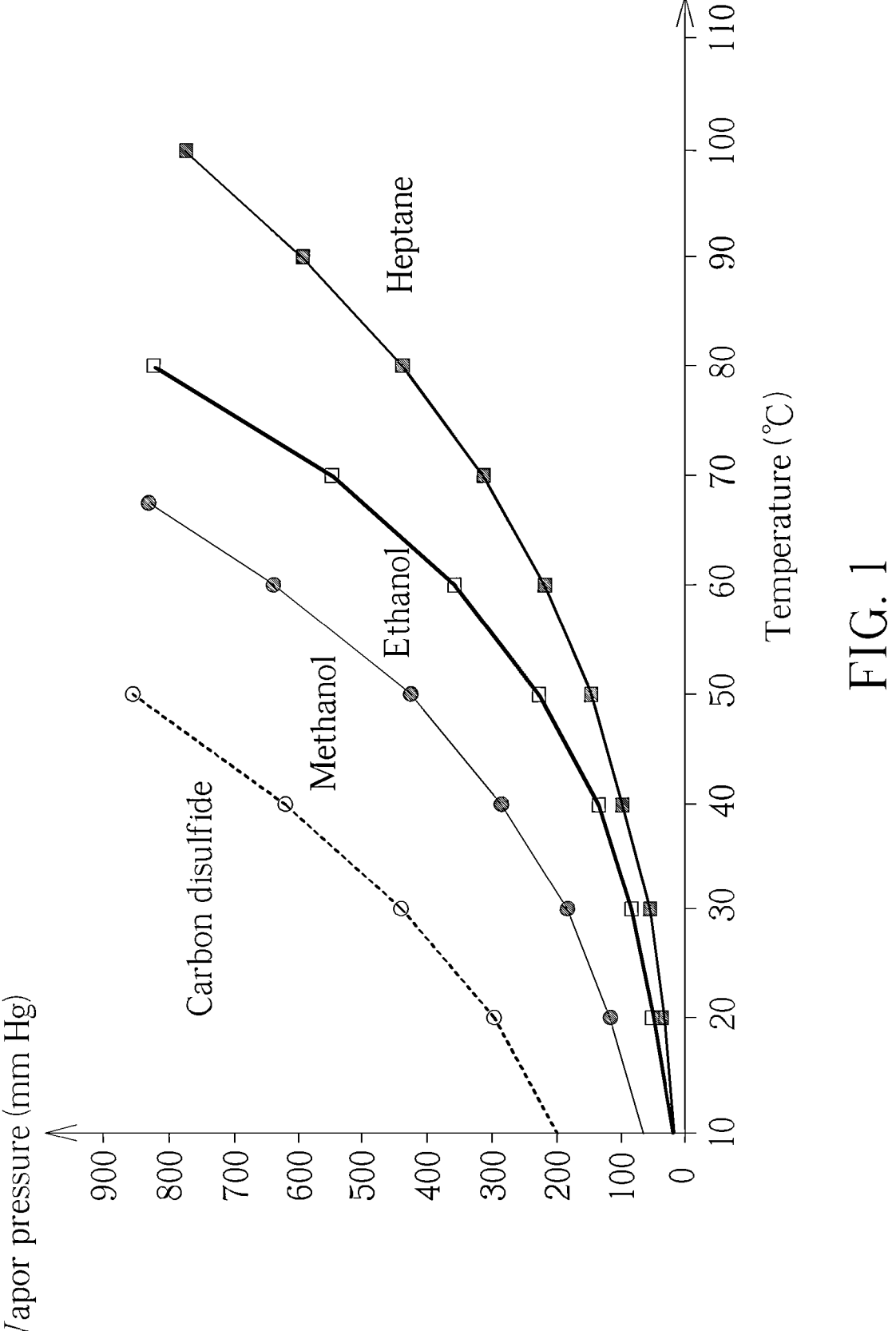
FIG. 1 illustrates vapor pressure versus temperature for various coolants.

Unless specified specifically, the term "coolant" in this invention generally refers to a substance chosen to have a vapor pressure A at boiling point $(m-k)\ °$ C., i.e., $k°$ C. below an upper bound $m°$ C. of device operating temperature range. For example, in an embodiment for smartphone processor cooling, the upper bound of processor operating temperature range is typically 85° C., i.e. $m \approx 85$. Assuming the target for k is 30° C., then for coolant as methanol as coolant, and a pressure of 0.7 ATM (532 mm Hg) will have a boiling point around 55° C., according to FIG. 1.

Coolant in the cooling system of present invention can be chosen according to chemical or physical properties thereof as well as practical requirements. Coolant gas or coolant vapor refer to coolant vaporized in gaseous state/phase.

Figure 2:
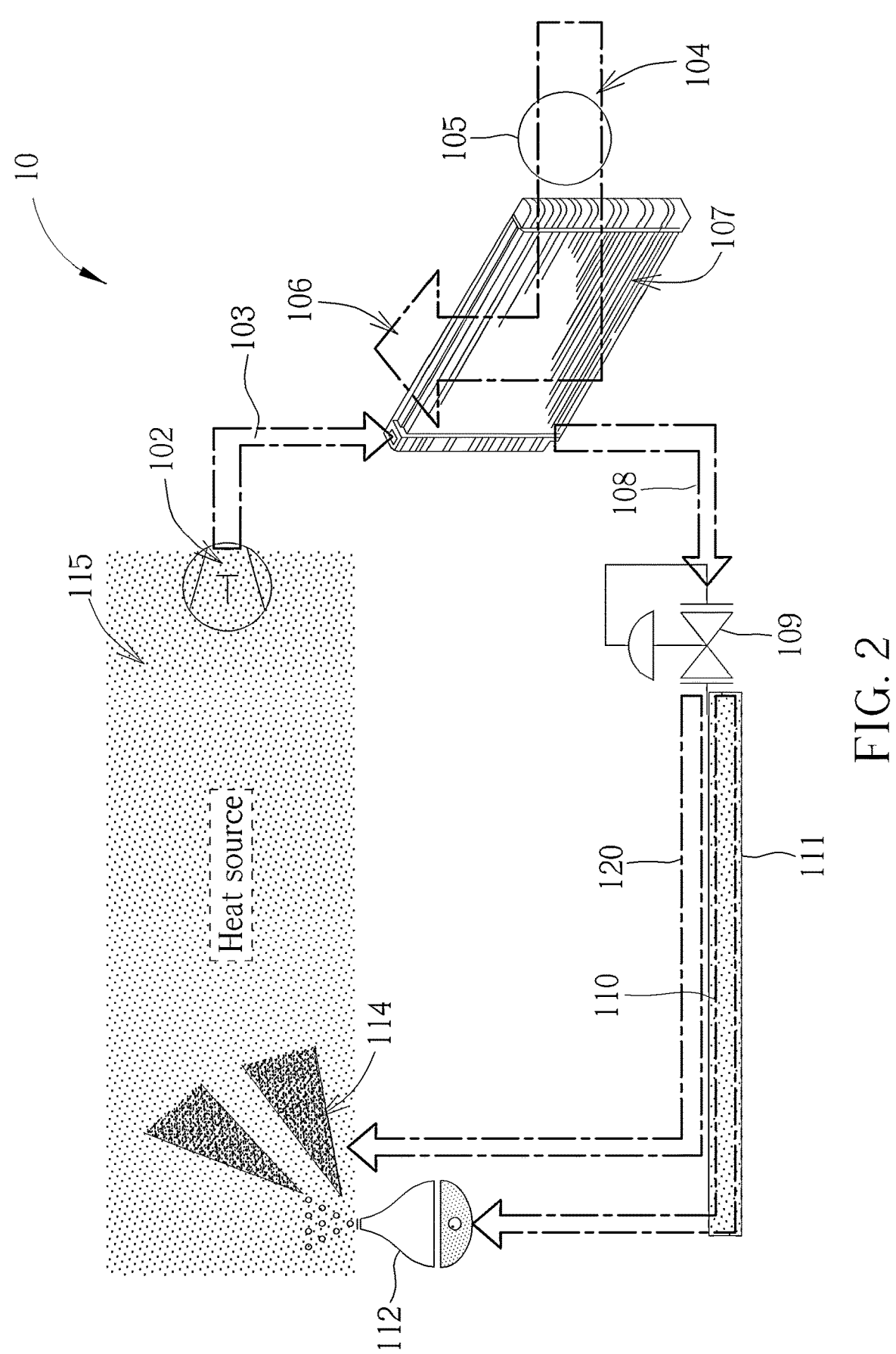
FIG. 2 is a schematic diagram of a cooling system according to an embodiment of the present application.

FIG. 2 is a schematic diagram of a cooling system 10 according to an embodiment of the present application. The cooling system 10 comprises a coolant (chosen according to certain requirement), a channel 115 encompassing a heat source 140, a coolant-droplets introducer 112, a compressor 102, a condenser 107, a pressure regulating valve 109 and a heat remover 105. The coolant-droplets introducer 112 may be similar to a mistifier or a humidifier and may comprise MEMS fabricated air pumping device, MEMS: Micro- Electro-Mechanical Systems). The coolant-droplets introducer 112 is configured to introduce coolant droplets into the channel 115. By absorbing heat generated by/from the heat source 120, the coolant droplets would vaporize as coolant gas (coolant in gaseous state/phase) within the channel 115. Note that, coolant droplets refer that the coolant is in liquid state/phase; while coolant gas refers that the coolant is in gaseous state/phase.

The compressor 102 (which may comprise MEMS fabricated air pumping device) is configured to pump/suck an air from a channel subspace into a condenser subspace. The air pumped/sucked into the condenser subspace contains/comprises the coolant gas. The compressor 102 is also configured to sustain an air pressure difference between the channel subspace and the condenser subspace, where an air pressure of the channel subspace is lower than an air pressure of the condenser subspace. That is, it may be considered as low pressure within the channel 115 and higher pressure in the condenser 107. In an embodiment, the air pressure of the condenser subspace may be sustained as 1.05 ATM and the air pressure of the channel subspace may be sustained as 0.8 ATM, but not limited thereto.

The condenser 107 is configured to condense the coolant gas back into coolant droplets or coolant liquid, i.e., condensing coolant in gaseous phase into coolant in liquid phase. The coolant droplets or coolant liquid (coolant in liquid phase) from the condenser 107 would be conducted and/or introduced to or for the coolant-droplets introducer 112.

Assume the compressor 102 can generate a pressure difference as 0.25 ATM, from its inlet to outlet, i.e., the compressor 102 may lower the pressure in channel 115 to 0.8 ATM while raise the pressure in condenser 107 to 1.05 ATM. Such difference in pressures causes the coolant to vaporize at a lower boiling power within channel 115 and condensate at a higher dew point within condenser 107. In this case, a system of asymmetrical liquid-gas phase transition points (or asymmetrical pair of boiling point and dew point) is thus created.

Note that, in the cooling system 10 with asymmetrical liquid-gas phase transition points, even if temperature of/within channel 115 and condenser 107 are the same, vaporization (in channel subspace) and condensation (in condenser subspace) will occur due to the pressure difference, absorbing/releasing latent heat while staying nearly constant temperature.

The pressure regulating valve 109 (which may comprise MEMS fabricated venting device) is configured to regulate a pressure difference between a pressure corresponding to the channel subspace (after the pressure regulating valve 109) and a pressure corresponding to the condenser subspace (before the pressure regulating valve 109), wherein the pressure after the pressure regulating valve 109 (correspond to channel subspace) shall be lower than the pressure before the pressure regulating valve 109 (correspond to condenser subspace). In an embodiment, to prevent unwanted vaporization of liquid coolant, pressure regulating valve 109 may be located much closer to the entrances of channel 115 than to condenser 107.

As condensation from gas to liquid is heat releasing process, the heat remover 105 is configured to remove heat released by the condenser 107. In an embodiment, the heat remover 105 may be or comprise an air movement device such as a fan or a blower (which may also be MEMS fabricated), but not limited thereto. In another embodiment, the heat remover 105 may be or comprise a chilling device or chiller, but not limited thereto.

Besides, a conduit 108 is to connect mixture of air and condensed liquid coolant between condenser 107 and pressure regulating valve 109. As mixture of air and coolant vapor injected into condenser 107 by compressor 102 will be separated into air and liquid coolant by the condensation process inside the condenser 107. After passing through expansion valve 109, the pressure is lowered to the level of subspace. The air will go through an air conduit 120 while the liquid coolant will go through another coolant conduit 110. Optionally, an insulation sleeve 111 may be used to prevent coolant from vaporizing.

In an embodiment, the coolant-droplets introducer 112 may comprise a reservoir part and a mister part. The reservoir part is used to store liquid coolant from the conduit 110. The mister part may be functionally and structurally the same as or similar to printing heads of inject printers. The mister part may inject microscopic coolant droplets, into airflow carried by conduit 120, toward channel 115. These airborne coolant droplets and airflow are infused together and form a mist-stream 114, where the mist-stream 114 is formed and injected from the coolant-droplets introducer 112 into the channel 115.

Note, in system 10 operation discussed above, so long as the coolant droplets in the mist-stream have not fully vaporized within channel subspace, the temperature within channel subspace may stay below or near boiling point due to latent vaporization heat adsorption.

In other words, when the coolant-droplets introducer 112 provides sufficient coolant droplets, a temperature of channel 115 may be kept no greater than a specific level (corresponding to the boiling point of the coolant at low air pressure), or kept within a specific range (e.g., within 5° C.). Heat generated by the heat source may be absorbed as latent heat of vaporization within the channel 115 and released as latent heat condensation within the condenser 107.

Note, the effect of "temperature stays below or near boiling point within subspace", achieved by latent vaporization heat absorption, may imply highly uniform temperature across the entire subspace.

Compared to the 2-phase immersion cooling systems, since coolant droplets forming such mist-stream are liquid, the primary feature of 2-phase liquid immersion cooling, utilizing latent heat absorption during liquid-to-gas phase change to achieve high heat exchange rate, is retained or inherited.

On the other hand, by replacing "body of liquid" with "stream of mist", the effective viscosity of the coolant is also reduced drastically, compared to the 2-phase immersion cooling systems. This sharply lower viscosity creates a new advantage over the original liquid form: the propensity of moving mist to permeate through very cracks and crevices, penetrate into every tiny space, so long as the droplets are much smaller than the dimension of those tiny spaces.

In addition, by replacing "body of liquid" with "stream of mist", there's no longer a "tank of liquid" which is prone to spill and/or leak all over the place, the problems about 2-phase liquid immersion cooling system such as installation, operation or maintenance, all become far more "manageable" and "solvable".

Combining those factors, this low-viscosity of "flowing mist stream" of coolant opens up new possibilities may be employed in one of the most challenging cooling needs in 3D packaged ICs, which is cooling between layers of silicon within one IC. It implies, not only can computation unit such as CPU/GPU/NPU/TPU (Central/Graphics/Neural network/Tensor Processing Unit) be heat source(s), TSV (through silicon via) may be part of heat source(s) as well.

Figure 3:
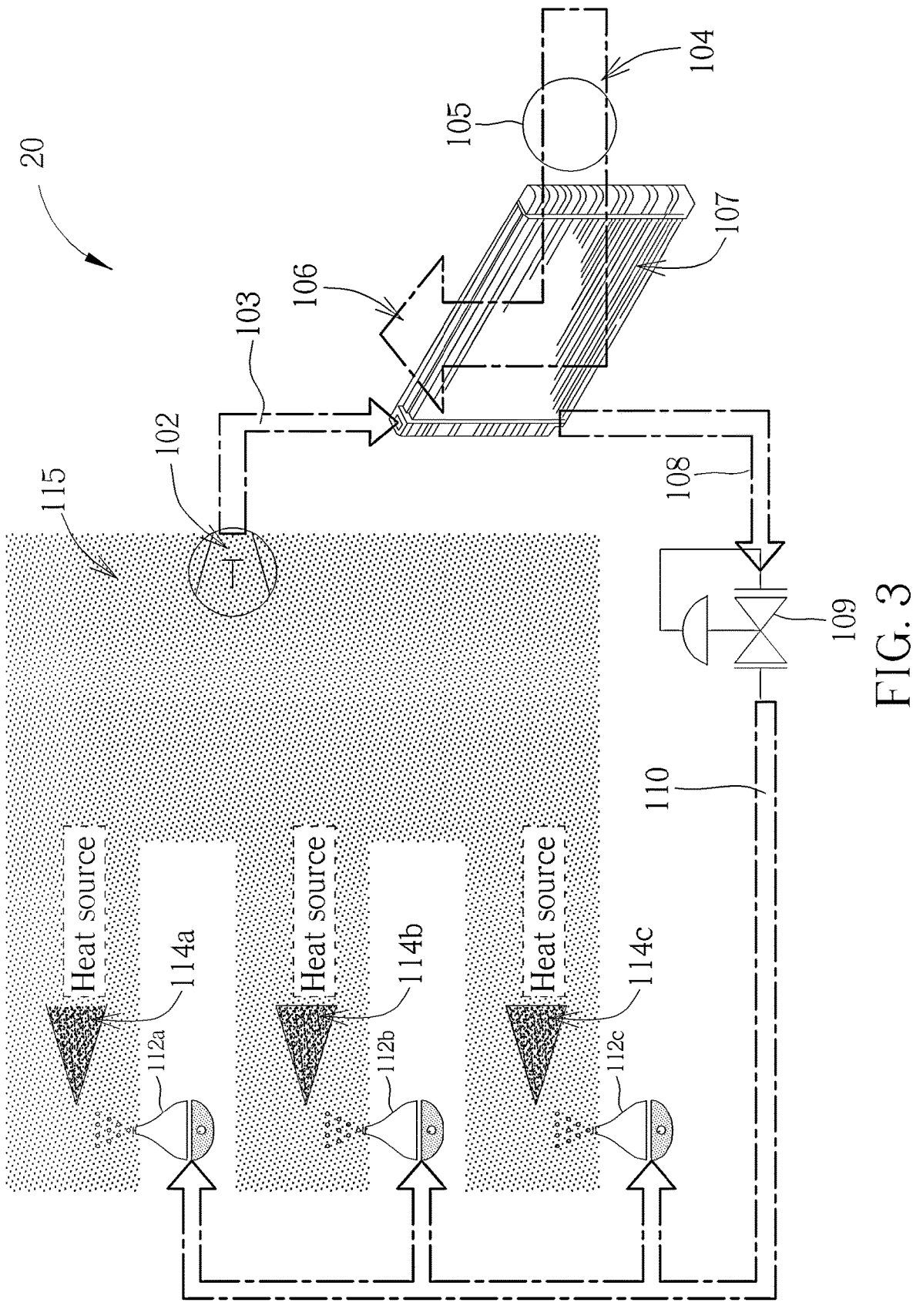
FIG. 3 is a schematic diagram of a cooling system according to an embodiment of the present application.

FIG. 3 is a schematic diagram of a cooling system 20 according to an embodiment of the present application. The cooling system 20 is similar to the cooling system 10. Different from the cooling system 10, the cooling system 20 employs multiple coolant-droplets introducers 112, so as to delivery of cooling resources (i.e., coolant droplets) more evenly than system 10, to prevent some region in channel 115 in which droplets is fully vaporized and temperature raise way above the boiling point.

Figure 4:
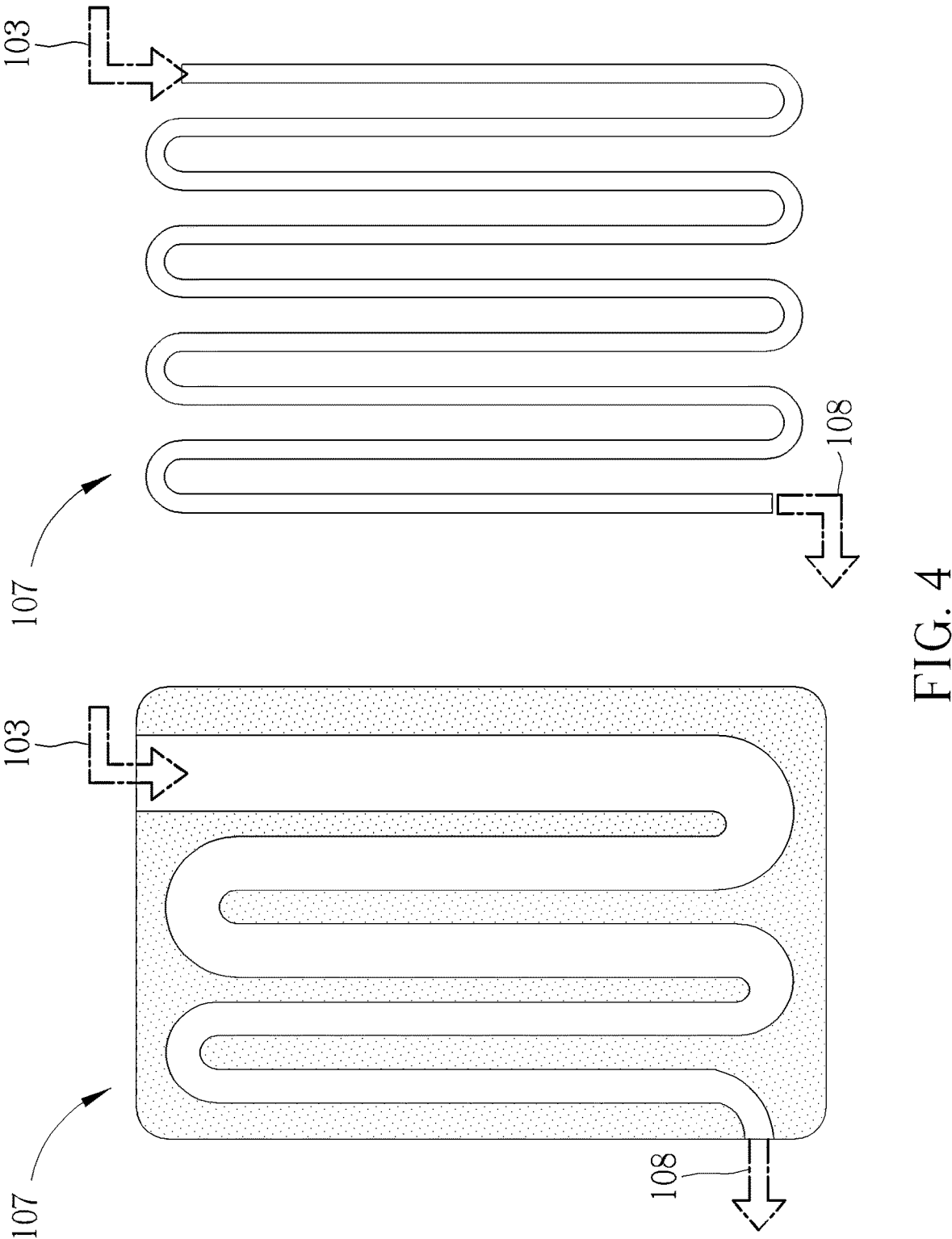
FIG. 4 illustrates schematic diagrams of a condenser according to an embodiment of the present application.

Note that, condenser 107 shown in FIG. 2 and FIG. 3 looks like a radiator, but not limited thereto. Structures, shapes, types of condenser 107 are not limited. For example, condenser 107 shown in FIG. 4 may comprise a tube with a repeating pattern of S-shaped curves. Moreover, a diameter of the tube within the condenser 107 may gradually narrow from inlet to outlet.

Some of the major differences between this invention and conventional (active) cooling system are listed below. First of all, the present invention utilizes latent heat between liquid and gas phase changes to achieve high heat dissipation rate. Second, the present invention establishes an asymmetrical pair of boiling point in channel 115 and dew point in condenser 107, by creating different pressure inside subspace and subspace. It is because boiling point in channel 115 is lowered because pressure in channel 115 is lowered, such that coolant droplets vaporize in channel 115. On the other hand, dew point in condenser 107 is raised because pressure in condenser 107 is increased, such that coolant gas condenses into coolant droplets or coolant liquid in condenser 107. In other words, boiling temperature (temperature corresponding to the boiling point) of the coolant in the channel 115 is lower than dew temperature (temperature corresponding to the dew point) of the coolant in the condenser, because of the pressure difference built by the compressor 102.

In addition, the present invention utilizes gaseous transport medium to move coolant droplets (in liquid phase) within the channel of the cooling system, and thus allow coolant droplets (in liquid phase) to permeate through and/or penetrate into every tiny opening/crevice. Moreover, the present invention uses the mister of the coolant-droplets introducer 112 to create mist-stream 114, or air-liquid mixture, instead of relying on only the coolant (liquid) as in 2-phase immersion cooling system, such that the coolant infused mist-stream would have has a viscosity close to (as low as) the gaseous transport medium and a heat dissipation rate close to (as high as) the immersion liquid cooling.

In summary, an active 2-phase mist cooling system is proposed in the present application. The cooling system utilizes coolant-droplets introducer to form and inject a mist-stream toward the channel encompassing the heat source, and utilizes the compressor to establish pressure difference between channel and condenser. Asymmetrical boiling point and dew point (at same temperature) are established. Heat of the heat source is absorbed as latent vaporization heat and released as latent condensation heat, while temperature in channel encompassing heat source may be maintained within a specific (tight) range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cooling system, comprising:
a channel, encompassing a heat source;
a coolant-droplets introducer, configured to inject coolant droplets into a gaseous flow to form a mist-stream, wherein the mist-stream is injected into the channel encompassing the heat source, wherein the coolant droplets vaporize as coolant gas in the channel due to heat generated by the heat source;
a compressor, configured to pump the coolant gas from the channel encompassing the heat source into a condenser; and
the condenser, configured to condense the coolant gas into coolant liquid;
wherein the coolant liquid is introduced to the coolant-droplets introducer to form the coolant droplets;
wherein an air conduit and a coolant conduit are separately coupled to the channel;
wherein the coolant droplets are forced into different regions of the channel before vaporizing as the coolant gas.

2. The cooling system of claim 1, comprising:
a pressure regulating valve, configured to regulate a pressure difference between a pressure corresponding to the channel and a pressure corresponding to the condenser.

3. The cooling system of claim 1, comprising:
a heat remover, configured to remove heat released by the condenser.

4. The cooling system of claim 3,
wherein the heat remover comprises an air movement device.

5. The cooling system of claim 3,
wherein the heat remover comprises a chilling device.

6. The cooling system of claim 1, comprising:
the air conduit, connected to the channel; and
the coolant conduit, connected to the coolant-droplets introducer.

7. The cooling system of claim 1, wherein the coolant-droplets introducer comprises:
a reservoir part and a mister part;
wherein the reservoir part is configured to store the coolant liquid;
wherein the mister part is configured to inject the coolant droplets into the channel.

8. The cooling system of claim 1, wherein the mist-stream comprises a gaseous transport medium and the coolant droplets, wherein the gaseous transport medium is infused with the coolant droplets.

9. The cooling system of claim 1,
wherein the compressor sustains a pressure difference between the channel and the condenser.

10. The cooling system of claim 9,
wherein the compressor sustains the pressure difference such that a boiling temperature of a coolant in the channel is lower than a dew temperature of the coolant in the condenser.

11. The cooling system of claim 1,
wherein the heat source comprises through silicon via (TSV) within integrated circuit (IC) package.

12. The cooling system of claim 1,
wherein a temperature of the channel is kept no greater than a specific level or kept within a specific range;
wherein the specific level is corresponding to a boiling point of a coolant at a pressure within the channel.

13. The cooling system of claim 1,
wherein the condenser comprises a tube with a repeating pattern of S-shaped curves.

14. The cooling system of claim 13,
wherein a diameter of the tube within the condenser is
   gradually narrow from an inlet to an outlet.

* * * * *